(12) United States Patent
Arjavac

(10) Patent No.: US 8,912,488 B2
(45) Date of Patent: Dec. 16, 2014

(54) AUTOMATED SAMPLE ORIENTATION

(71) Applicant: FEI Company, Hillsboro, OR (US)

(72) Inventor: Jason Arjavac, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 106 days.

(21) Appl. No.: 13/677,940

(22) Filed: Nov. 15, 2012

(65) Prior Publication Data

US 2014/0131572 A1      May 15, 2014

(51) Int. Cl.
| | | |
|---|---|---|
| *H01J 37/00* | (2006.01) | |
| *H01J 37/26* | (2006.01) | |
| *H01J 37/20* | (2006.01) | |

(52) U.S. Cl.
CPC ............... *H01J 37/20* (2013.01); *H01J 37/265* (2013.01)
USPC ............ 250/307; 250/306; 250/310; 250/311

(58) Field of Classification Search
CPC .................. H01J 2237/2611; G06K 2209/403; G06K 9/00134
USPC ................................... 250/306, 307, 310, 311
See application file for complete search history.

(56) References Cited

U.S. PATENT DOCUMENTS

| | | | | |
|---|---|---|---|---|
| 7,463,791 | B2 * | 12/2008 | Koehler et al. | 382/294 |
| 7,611,610 | B2 | 11/2009 | Nadeau et al. | |
| 8,163,145 | B2 | 4/2012 | Nadeau et al. | |
| 2005/0040332 | A1 * | 2/2005 | Kochi et al. | 250/310 |
| 2009/0212214 | A1 * | 8/2009 | Kimba | 250/310 |
| 2009/0309022 | A1 * | 12/2009 | Gunji et al. | 250/307 |
| 2010/0308219 | A1 | 12/2010 | Blackwood et al. | |
| 2011/0006207 | A1 | 1/2011 | Arjavac et al. | |
| 2012/0199923 | A1 | 8/2012 | Nadeau et al. | |
| 2014/0084157 | A1 | 3/2014 | Miller et al. | |

* cited by examiner

*Primary Examiner* — Michael Maskell
(74) *Attorney, Agent, or Firm* — Scheinberg & Associates, PC; Michael O. Scheinberg; Ki O

(57) ABSTRACT

A method for aligning a sample that is placed in the vacuum chamber so that the sample is oriented normal to the focused ion beam is disclosed. The locations of different spots on the sample surface are determined using a focusing routine. The locations of the different spots are used to create an image line or an image plane that determines the proper calibrations that are needed. The image line or image plane is then used to calibrate the sample stage so that the sample is aligned substantially normal to the focused ion beam.

14 Claims, 7 Drawing Sheets

AUTOMATED SAMPLE ORIENTATION

TECHNICAL FIELD OF THE INVENTION

The present invention relates to preparation of samples and methods of analysis for transmission electron microscopes and scanning transmission electron microscopes.

BACKGROUND OF THE INVENTION

Semiconductor manufacturing, such as the fabrication of integrated circuits, typically entails the use of photolithography. A semiconductor substrate on which circuits are being formed, usually a silicon wafer, is coated with a material, such as a photoresist, that changes solubility when exposed to radiation. A lithography tool, such as a mask or reticle, positioned between the radiation source and the semiconductor substrate casts a shadow to control which areas of the substrate are exposed to the radiation. After the exposure, the photoresist is removed from either the exposed or the unexposed areas, leaving a patterned layer of photoresist on the wafer that protects parts of the wafer during a subsequent etching or diffusion process.

The photolithography process allows multiple integrated circuit devices or electromechanical devices, often referred to as "chips," to be formed on each wafer. The wafer is then cut up into individual dies, each including a single integrated circuit device or electromechanical device. Ultimately, these dies are subjected to additional operations and packaged into individual integrated circuit chips or electromechanical devices.

During the manufacturing process, variations in exposure and focus require that the patterns developed by lithographic processes be continually monitored or measured to determine if the dimensions of the patterns are within acceptable ranges. The importance of such monitoring, often referred to as process control, increases considerably as pattern sizes become smaller, especially as minimum feature sizes approach the limits of resolution available by the lithographic process. In order to achieve ever-higher device density, smaller and smaller feature sizes are required. This may include the width and spacing of interconnecting lines, spacing and diameter of contact holes, and the surface geometry such as corners and edges of various features. Features on the wafer are three-dimensional structures and a complete characterization must describe not just a surface dimension, such as the top width of a line or trench, but a complete three-dimensional profile of the feature. Process engineers must be able to accurately measure the critical dimensions (CD) of such surface features to fine tune the fabrication process and assure a desired device geometry is obtained.

Typically, CD measurements are made using instruments such as a scanning electron microscope (SEM). In a scanning electron microscope (SEM), a primary electron beam is focused to a fine spot that scans the surface to be observed. Secondary electrons are emitted from the surface as it is impacted by the primary beam. The secondary electrons are detected, and an image is formed, with the brightness at each point of the image being determined by the number of secondary electrons detected when the beam impacts a corresponding spot on the surface. As features continue to get smaller and smaller, however, there comes a point where the features to be measured are too small for the resolution provided by an ordinary SEM.

Transmission electron microscopes (TEMs) allow observers to see extremely small features, on the order of nanometers. In contrast SEMs, which only image the surface of a material, TEM also allows analysis of the internal structure of a sample. In a TEM, a broad beam impacts the sample and electrons that are transmitted through the sample are focused to form an image of the sample. The sample must be sufficiently thin to allow many of the electrons in the primary beam to travel though the sample and exit on the opposite site. Samples, also referred to as lamellae, are typically less than 100 nm thick.

In a scanning transmission electron microscope (STEM), a primary electron beam is focused to a fine spot, and the spot is scanned across the sample surface. Electrons that are transmitted through the work piece are collected by an electron detector on the far side of the sample, and the intensity of each point on the image corresponds to the number of electrons collected as the primary beam impacts a corresponding point on the surface.

Because a sample must be very thin for viewing with transmission electron microscopy (whether TEM or STEM), preparation of the sample can be delicate, time-consuming work. The term "TEM" as used herein refers to a TEM or an STEM and references to preparing a sample for a TEM are to be understood to also include preparing a sample for viewing on an STEM. The term "S/TEM" as used herein also refers to both TEM and STEM.

Several techniques are known for preparing TEM specimens. These techniques may involve cleaving, chemical polishing, mechanical polishing, or broad beam low energy ion milling, or combining one or more of the above. The disadvantage to these techniques is that they are not site-specific and often require that the starting material be sectioned into smaller and smaller pieces, thereby destroying much of the original sample.

In metrology, precise crystallographic alignment is often needed for proper STEM and TEM analysis. In the same token, material stack alignment is needed for non-crystallographic materials. Traditional routines for alignment of crystallographic structures or material stack alignment for non-crystallographic materials involve routines that can be extensively time consuming that requires multiple focusing routines when a sample is positioned or tilted.

What is needed is a repeatable method of TEM sample alignment to the incoming TEM or STEM beam, or charged particle beam. A routine that a robust and easy method of aligning the sample that is not dependent on crystalline orientation of the sample could enhance the throughput of the analysis process.

SUMMARY OF THE INVENTION

An object of the present invention, therefore, is to provide an improved method for orienting the sample in a TEM or STEM analysis. Preferred embodiments of the present invention provide for a method of selecting an area of interest, choosing two points on the area of interest, creating an image line of the two points, and calibrating the line so that the image line is perpendicular to the incident charged particle beam.

Some preferred embodiments of the present invention provide a method for orienting a sample in a TEM or STEM analysis that uses three points from an area of interest and creating an image plane that the image plane can be used to calibrate the sample.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Embodiments of the present invention are directed to improved methods for TEM sample alignment by using methods to focus on separate locations of a sample to determine its orientation with respect to the charged particle beam. Once the orientation is determined, the sample stage can be changed in the X-Y-Z axis to properly align the sample normal to the charged particle beam. Such methodologies allow for easy and robust sample alignment with high throughput capabilities.

Figure 1:
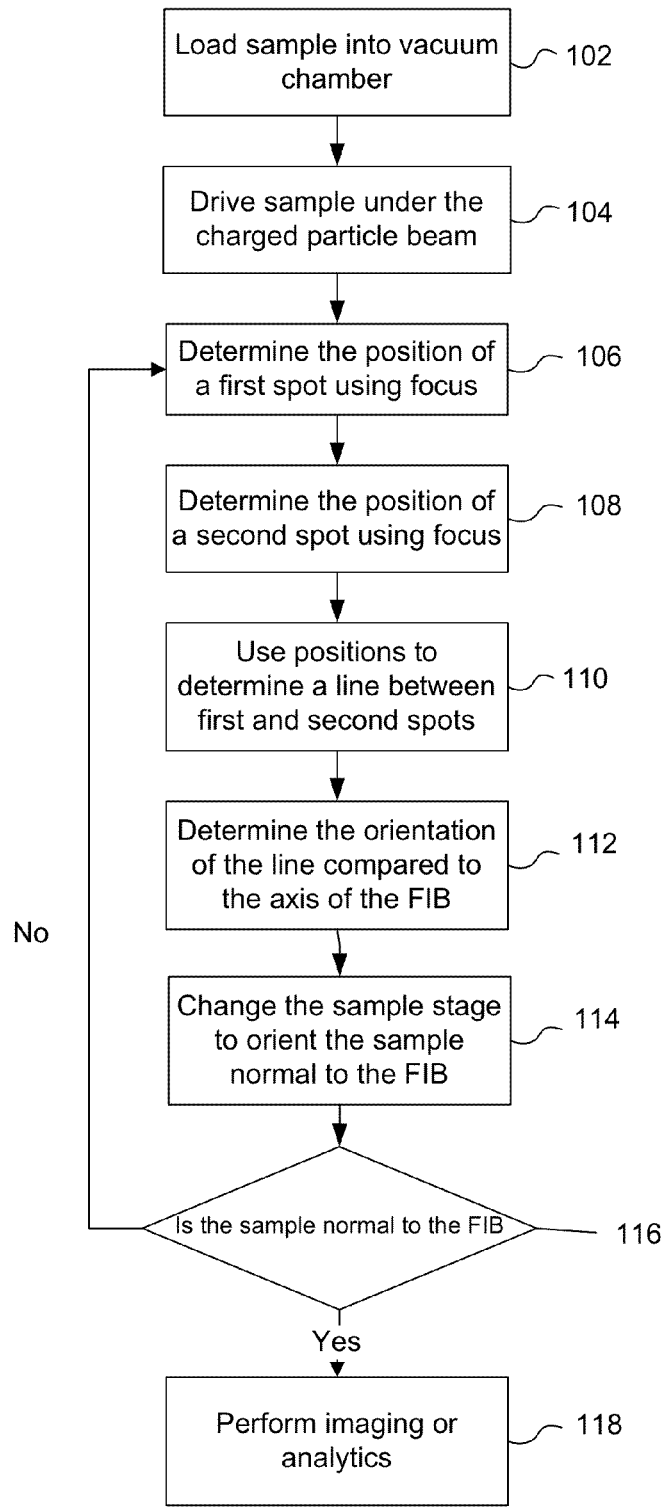
FIG. 1 is a flowchart showing a standard alignment procedure in accordance with a preferred embodiment of the invention that involves the selection of two points.

FIG. 1 shows a flow chart of the method in accordance with one embodiment of the present invention. This method allows for the orientation of a sample in two dimensions by utilizing capabilities for the system to focus on two separate points of a sample and use the focusing system to determine the distance from a fixed point. The fixed point is generally a point that is eucentric on the objective lens. The focusing is performed using traditional autofocusing methods or manual focusing methods. Traditional autofocus methods allow the user to discern the distance from a fixed point. Active autofocus routines may emit utltrasonic sound waves or infrared light and calculate the delay in their reflections to determine the distance. Passive autofucusing routines split the reflection of light from the sample into pairs and compare the phase changes of them. Manual focusing routines also allow for the determination of the distances of separate points on a sample from a fixed point. The use of FEI' s TEMLink's Windows®-based graphical user interface guides with the Wizard Style routine guides a user through specific steps that allow the user to make proper determination of distances from a sample site. The system can allow for determination of lamella orientation.

Figure 2:
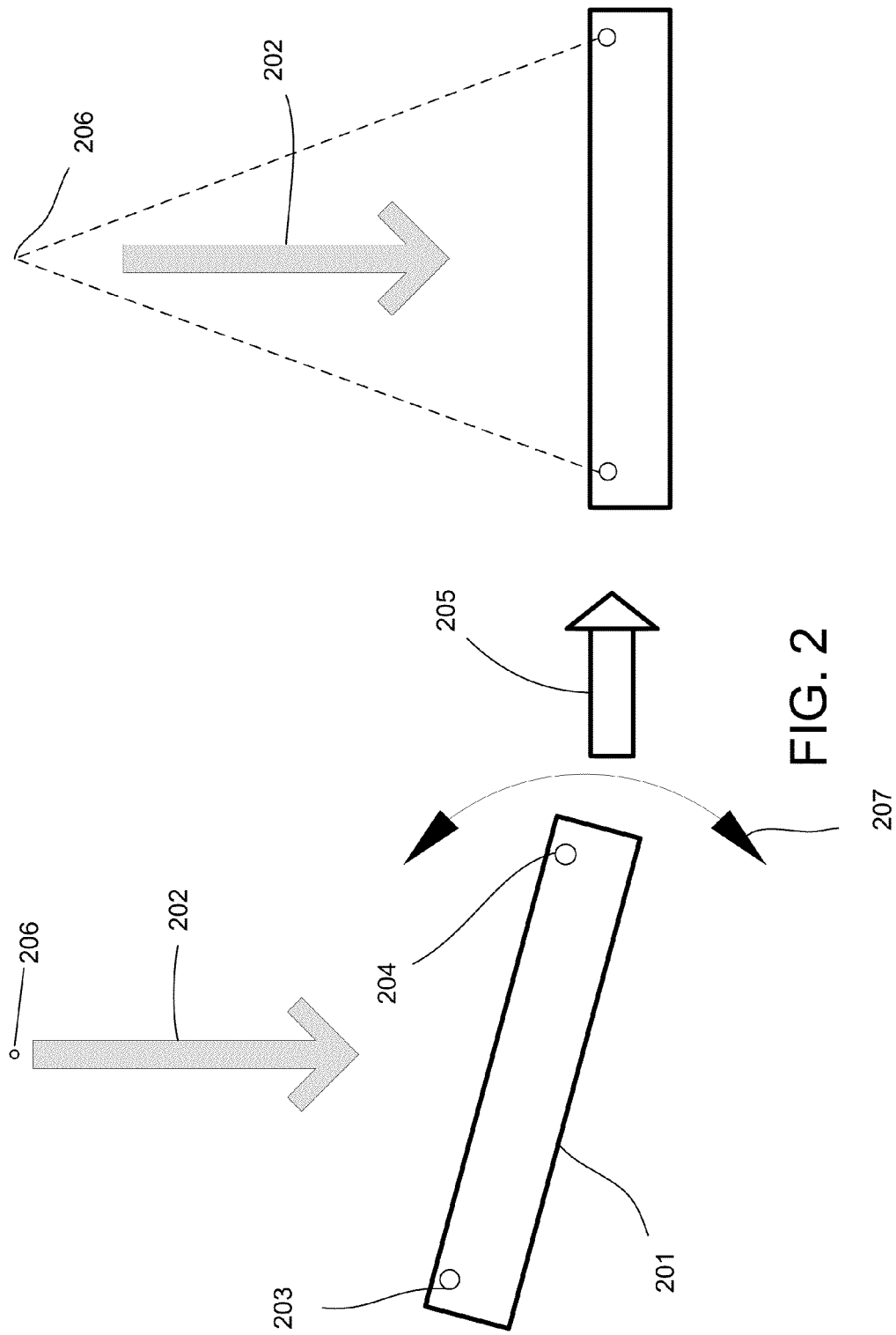
FIG. 2 is a schematic showing how the alteration of the sample stage can properly align the sample with the charged particle beam in accordance with a preferred embodiment of the invention.

Two dimensional alignment of a sample is used when one side of the sample is higher than the other so that the sample is not aligned with the charged particle beam. As shown in FIG. 2, sample 201 on the left side is not properly aligned to the charged particle beam 202. A first side 203 of the sample 201 is closer to the charged particle beam 202 than a second side 204. A focusing routine can determine the distance of first side 203 from a fixed point 206 that is eucentric to the charged particle beam 202. Another focusing routine can determine the distance of second side 204 from the fixed point 206. By calculating the differences between the distances of first side 203 and second side 204, an algorithm can be used to draw a line between the points of a first side 203 and a second side 204 and determine its orientation in comparison to a line that is orthogonal to the charged particle beam. Once the orientation of the line is determined, an automatic control system or manual control system can determine how much to rotate the sample stage in the Y axis rotation 207 so that first side 203 and second side 204 are equidistance from fixed point 206. It should be noted that many other points can be considered fixed points, such as the point of a focused probe, for calculation purposes. Once the first side 203 and the second side 204 are equidistance from fixed point 206, the sample is considered properly oriented in one dimension with respect to the charged particle beam 202.

The first step 102 of FIG. 1 is for a user to load a sample into a vacuum chamber containing a charged particle beam. The system can be a TEM or STEM. In the next step 104, the sample is driven in the Z-axis with the charged particle beam. In one auto eucentric routine, an image can be taken, followed by a reference image. The sample stage is tilted and a second reference image is taken. The shift in the XY space along with the known tilt cans product a vector to move the stage to correct for Z-axis.

In another auto eucentric routine is by minimizing the feature shift during a continuously tilting sample. In a manual routine, the focus is set to be optimized at the eucentric height, which involves the continuous movement of the stage until the image is sharply focused. Once the image stops moving, the sample is considered to be at the eucentric height.

In accordance with embodiments of the present invention, an area of the sample 201 is chosen for alignment, and in step 106, a first spot of the area is determined. A focusing routine will determine the X,Y point locations of the first stop. In step 108, the X,Y point locations of a second spot on the chosen area is determined by shifting the charged particle beam 202 to the location and running the focusing routine. In step 110, the controller (not shown) is used to determine the orientation of the line that is drawn between the first two points. Using an algorithm, the orientation of the line between the two points is compared to an imaginary normal line with the charged particle beam 202 in step 112. The sample stage is tilted in the Y-axis to orient the sample in accordance with the calculations in step 114. If the sample is properly aligned with the charged particle beam (step 116), then the alignment routine is over and the sample is ready for further imaging or analytics in step 118. If the sample is not properly aligned, the procedure can be performed over again by going back to step 106.

Figure 3:
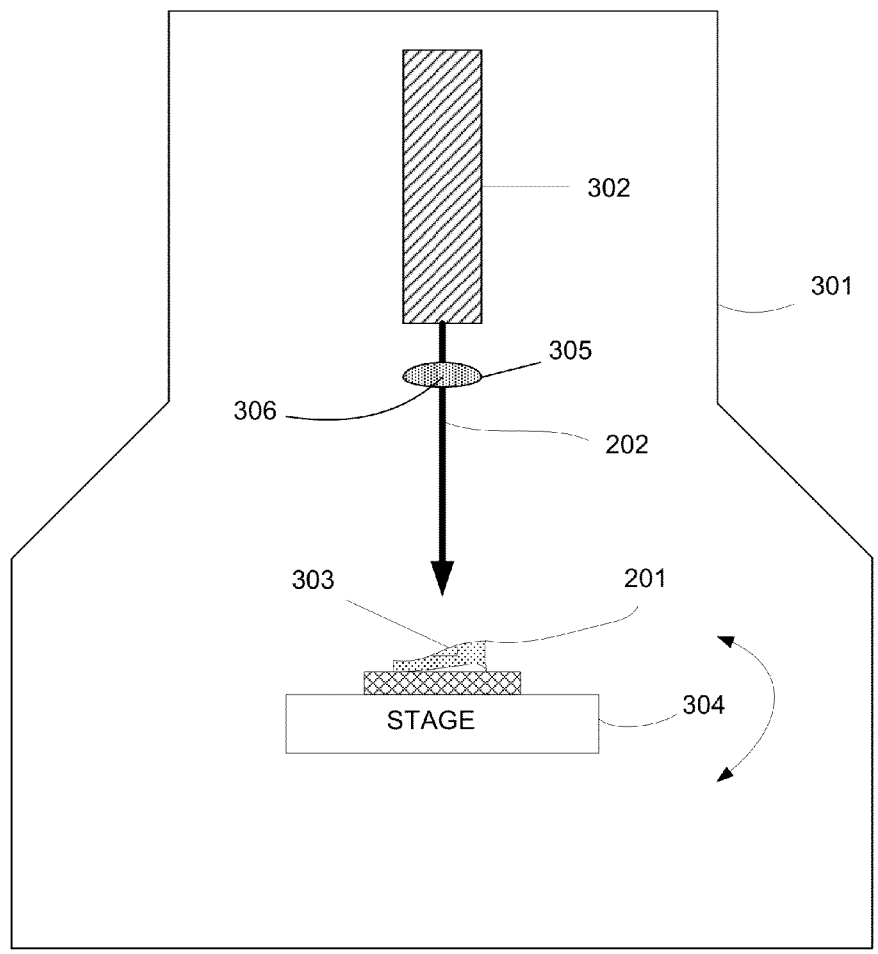
FIG. 3 illustrates a vacuum chamber in accordance with the preferred embodiment of the present invention prior to alignment.
Figure 4:
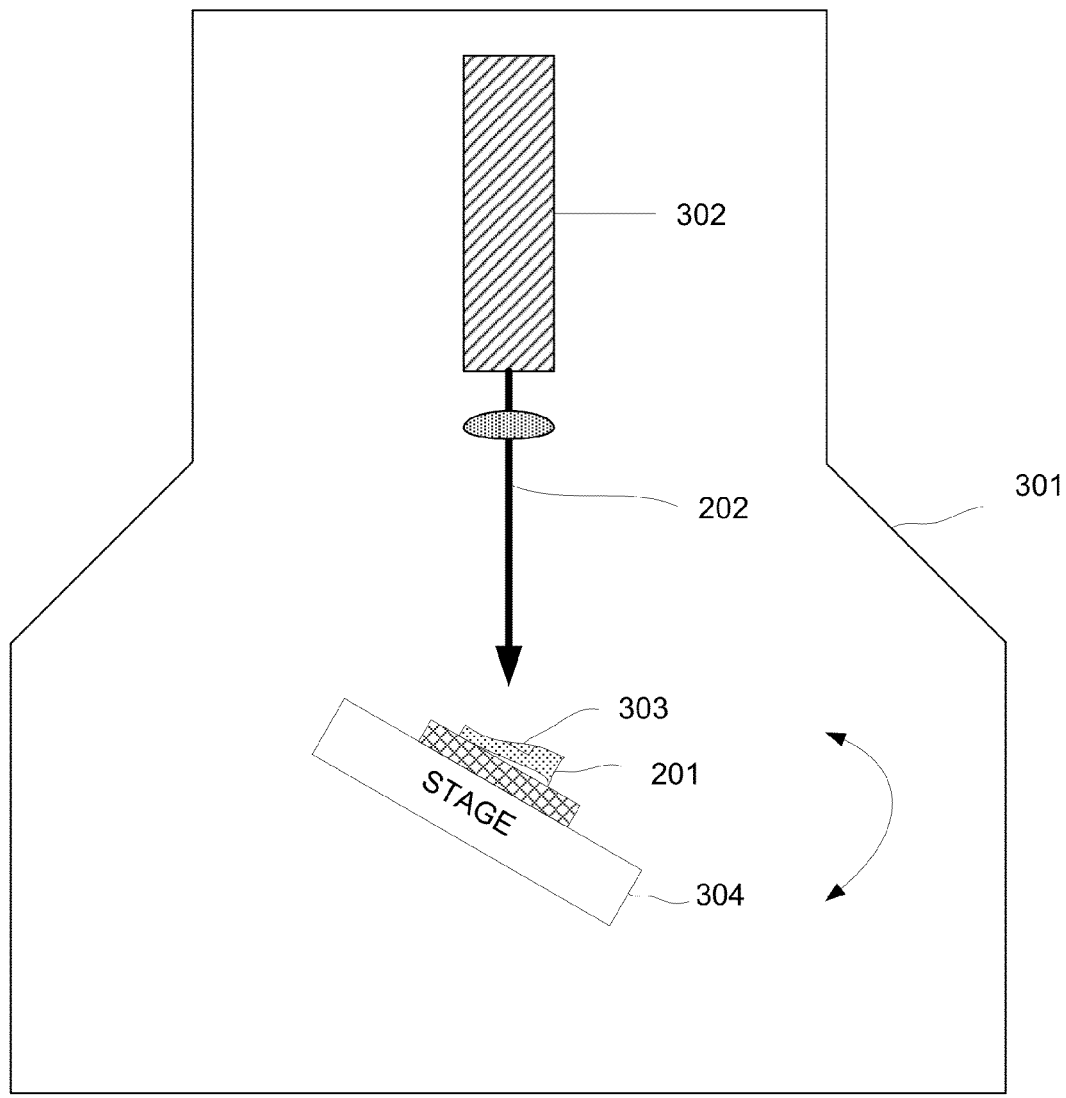
FIG. 4 illustrates a vacuum chamber in accordance with the preferred embodiment of the present invention post-alignment.

FIG. 3 shows a vacuum chamber 301 with a charged particle beam column 302 having a charged particle beam 202. The charged particle beam 202 is directed at a sample 201 that is already driven the Z-axis. Sample 201 has an area for alignment 303. Once a user selects a surface area for alignment 303, the user will select various points in that area for the focusing routines. The alignment of sample 201 will be determined by the orientation of surface area for alignment 303. A fixed point, usually a eucentric point 306 on lens 305, will be used to determine the distance of each of the points that undergoes the focusing routine. XY stage 304 is able to rotate in the Y-axis so that the surface area for alignment 303 can be oriented with the charged particle beam 202. Once the surface area for alignment 303 goes through the alignment procedure of FIG. 1, the surface area for alignment 303 will be aligned orthogonally to the charged particle beam 202, as shown in FIG. 4. FIG. 4 shows the system for alignment after the XY stage 304 has been rotated to properly orient the sample.

Although the above embodiment serves the user well in determining the proper orientation of a sample when one side is higher than the other, oftentimes, the sample is not properly oriented in more than one dimension. For example, a sample that is on a sample stage may have an area of interest that is not properly oriented with the charged particle beam in more than one dimension. The area of interest may be misaligned in an X and Y direction. In such a situation, another preferred embodiment of the current invention uses three points on the area of interest to perform an autofocus routine that determines the orientation of the sample by calculating the plane shared by the three points.

Figure 5:
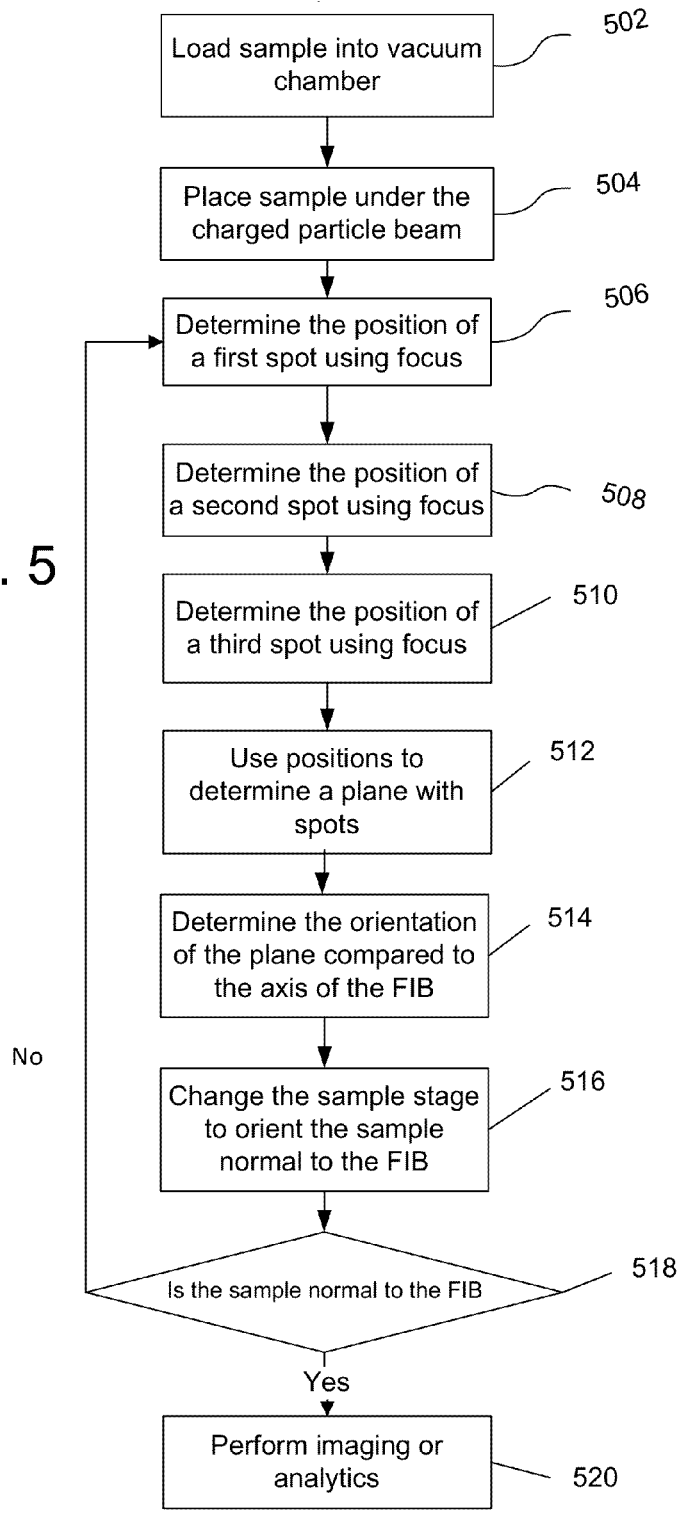
FIG. 5 is a flowchart showing a standard alignment procedure in accordance with a preferred embodiment of the invention that involves the selection of three points.

FIG. 5 shows the flow chart for the preferred embodiment having three points for alignment of the sample with the charged particle beam. Similar to the two point alignment of the sample, the three point alignment starts off with step 502 wherein a user loads a sample into a vacuum chamber containing a charged particle beam. In the next step 504, the sample is driven in the Z-axis with the charged particle beam. Next, an area of interest for alignment 303 is chosen. The position of the first spot for a focusing routine is determined in step 506. A focusing routine will determine the exact position of point in the X, Y, and Z directions. In steps 508 and 510, a second spot and a third spot position are determined in the X, Y, Z directions. The charged particle beam is shifted to each of these positions before the focusing routine is performed. In step 512, the controller (not shown) is used to map out a plane using the three points and in step 514, the orientation of the plane using the three points are compared to the axis of the charged particle beam.

Figure 6:
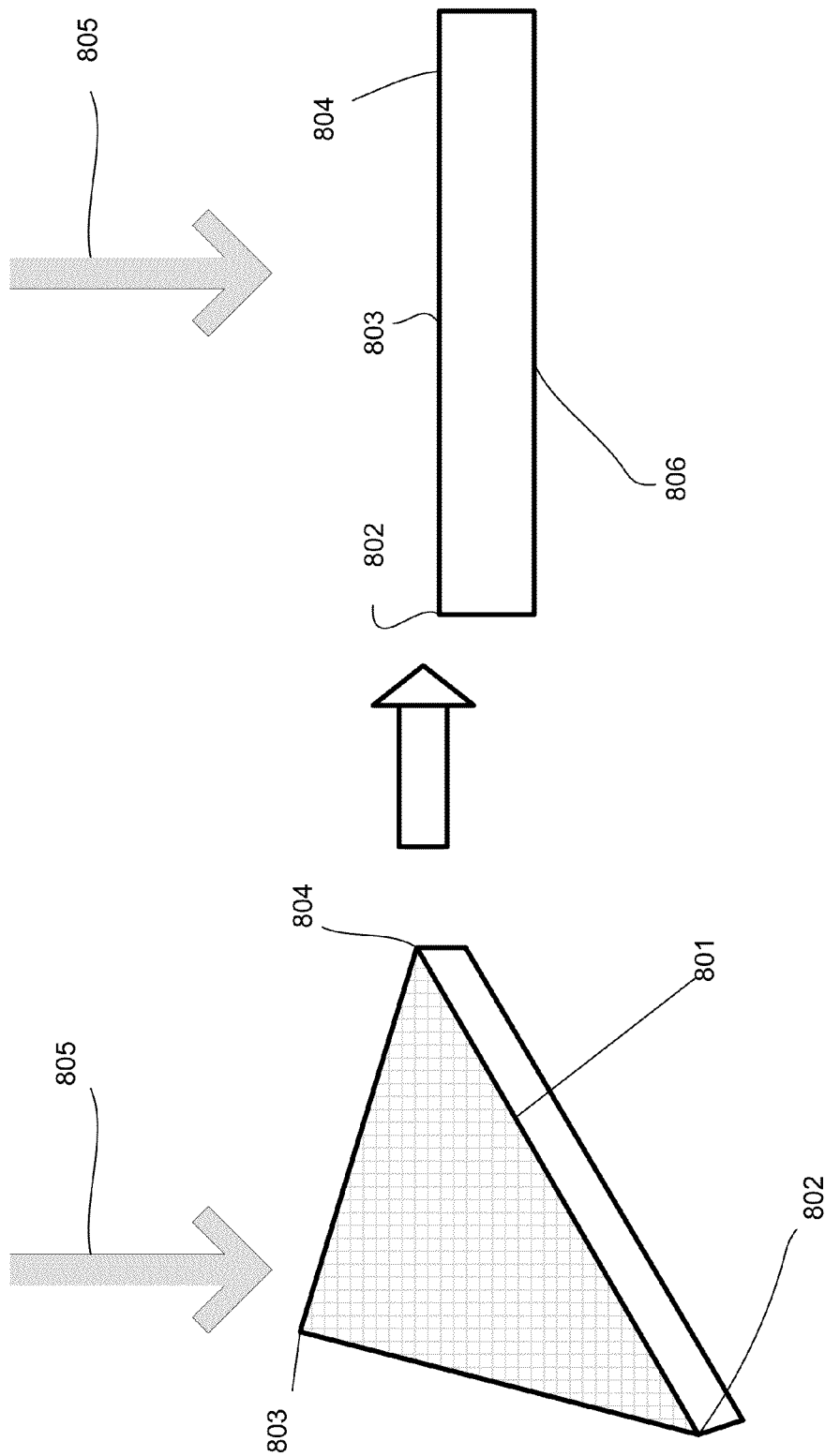
FIG. 6 illustrates the triangulation of three points to form a plane so that the proper alignment of the sample can be made in accordance with a preferred embodiment of the present invention.

FIG. 6 shows a three dimensional view of an incoming sample 801 having points 802, 803, and 804. The incoming sample 801 is not aligned with the charged particle beam 805. Points 802, 803, and 804 can all be at different distances from a eucentric fixed point of the charged particle beam, which in most instances is a eucentric point on the lens of the charged particle beam. The plane that is determined using the three points 802, 803, and 804 is compared to a normal plane of the charged particle beam. Conventional algorithms exist in defining a plane. The graphical triangulation of the points can be aided by the user that selects the corners of triangulation. The post alignment sample will have all three points 802, 803, and 804 form a plane that is perpendicular to the charged particle beam 805.

Figure 7:
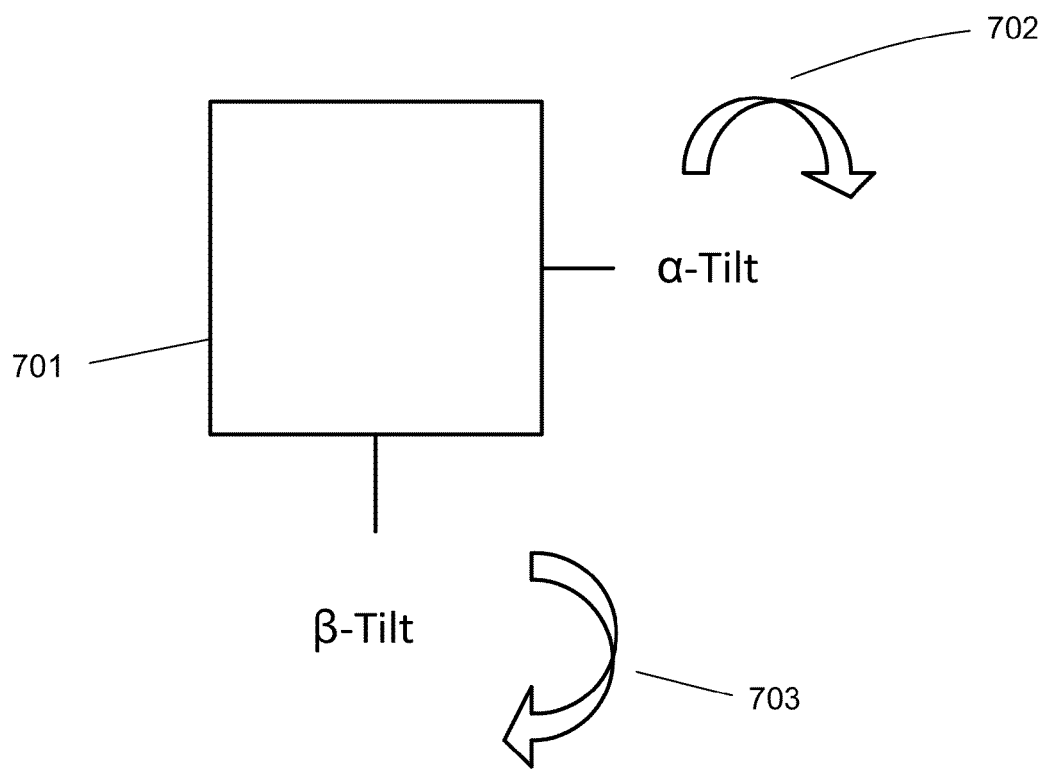
FIG. 7 illustrates the sample stage in accordance with the preferred embodiment of the present invention that shows how the sample stage can be tilted in the various axis.

FIG. 7 shows the sample stage 701. Sample stage 701 has an α-Tilt rotational axis 702 and a β-Tilt rotational axis 703 that allows for an XY plane shifting so that the area of interest on the sample can be aligned perpendicularly to the charged particle beam. The image plane of the sample prior to orientation and the necessary calibrations for the α-Tilt rotational axis 702 and a β-Tilt rotational axis 703 that are necessary are performed. Step 516 of FIG. 5 shows the next step of changing the sample stage in the α-Tilt rotational axis and the β-Tilt rotational axis in accordance with the orientation of the area of interest. If the sample is properly aligned with the charged particle beam (step 518), then the alignment routine is over and the sample is ready for further imaging or analytics in step 520. The translation of the image plane determined by the focus routine of the three points 802, 803, and 804 allow for precise sample alignment bringing the region of interest normal to the incident charged particle beam. If the sample is not properly aligned, the procedure can be performed over again by going back to step 506.

The routine can be independent of the crystalline orientation, which results in ability to manage the orientation of the sample much quicker than traditional methodologies. The current invention utilizes a routine that can be accomplished in less than 45 seconds, as opposed to 180-360seconds to complete the traditional CD-STEM automated routines known. In accordance, the routine can also incorporate a complementary alignment step to account for the crystalline structures.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method for orienting a sample in a charged particle beam system comprising:
   loading a sample into a vacuum chamber having a charged particle beam;
   placing the sample under a charged particle beam;
   selecting an area of the sample to orient;
   guiding the charged particle beam to at least two different spots on the sample surface;
   focusing the charged particle beam on the at least two different spots;
   determining the distance of each spot from a fixed spot that is substantially eucentric to the objective lens;
   using the distances of each spot to orient the sample so that the sample is oriented normal to the charged particle beam by tilting the sample stage.

2. The method of claim 1 wherein two different spots are used to create a line that is used for sample orientation.

3. The method of claim 2 wherein the sample orientation is performed by making the ends of the line equidistant from a fixed spot.

4. The method of claim 1 in which using the distances of each spot to orient the sample includes moving the stage in the XY plane.

5. The method of claim 1 wherein three different spots are used to create a two dimensional plane that is used for sample orientation.

6. The method of claim 1 wherein the focusing is performed using an autofocus routine.

7. The method of claim 1 wherein the focusing is performed using a manual focus routine.

8. A method for aligning a sample in a charged particle beam system comprising:
- loading a sample on a sample stage in a vacuum chamber having a charged particle beam;
- calibrating the sample in a Z-axis in line with the charged particle beam;
- selecting an area of the sample to orient;
- aiming the charged particle beam on a first spot of the area of the sample to orient;
- performing a first focusing routine to define a first X, Y, Z points;
- shifting the charged particle beam in the X-Y plane;
- performing a second focusing routine to define a second X, Y, Z points;
- using the first X, Y, Z points and the second X, Y, Z points to determine the orientation of the sample; and
- changing the orientation of the sample stage by moving and/or tilting the sample stage so that the sample is oriented normal to the charged particle beam.

9. The method of claim 8 wherein the first focusing routine and the second focusing routine are performed using an autofocusing lens.

10. The method of claim 8 wherein the first focusing routine and the second focusing routine are performed using a manual focusing procedure.

11. The method of claim 8 further comprising the steps of:
- performing a third focusing routine to define a third X, Y, Z points;
- using the first X, Y, Z points, the second X, Y, Z points, and third X, Y, Z points to determine a two dimensional orientation of the sample.

12. The method of claim 11 wherein the two dimensional orientation of the sample is used to align the sample substantially normal to the charged particle beam.

13. The method of claim 11 wherein the first, second, and third focusing routine use an autofocus routine.

14. The method of claim 11 wherein the first, second, and third focusing routine use a manual focusing routine.

* * * * *